US005115884A

United States Patent [19]

Falco

[11] Patent Number: 5,115,884

[45] Date of Patent: May 26, 1992

[54] LOW DISTORTION AUDIO SPEAKER CABINET

[76] Inventor: James Falco, 33-54 165th St., Flushing, N.Y. 11358

[21] Appl. No.: 417,183

[22] Filed: Oct. 4, 1989

[51] Int. Cl.[5] ............ H05K 5/00

[52] U.S. Cl. ............ 181/156; 181/151; 181/172; 381/205

[58] Field of Search ............ 181/141, 148, 151, 156, 181/171, 172, DIG. 1; 381/205

[56] References Cited

U.S. PATENT DOCUMENTS

| | | | |
|---|---|---|---|
| 2,315,896 | 4/1943 | Dumas | 181/151 |
| 3,430,728 | 3/1969 | Dunning | 181/151 X |
| 3,716,671 | 2/1973 | Karr | 181/156 X |
| 3,757,889 | 9/1973 | Everitt | 181/156 |
| 3,771,621 | 11/1973 | Goettl | 181/151 |
| 4,572,326 | 2/1986 | Hutchins | 181/156 X |
| 4,624,338 | 11/1986 | Ewald | 181/148 |
| 4,939,783 | 7/1890 | Dunning | 181/172 |

FOREIGN PATENT DOCUMENTS

| | | | |
|---|---|---|---|
| 2854899 | 7/1980 | Fed. Rep. of Germany | 181/156 |

*Primary Examiner*—Benjamin R. Fuller
*Assistant Examiner*—David Yockey
*Attorney, Agent, or Firm*—Auslander & Thomas

[57] ABSTRACT

In an audio speaker system and speaker-cabinet combination, a speaker positioned in a cabinet is mounted to the cabinet by a mounting assembly made of non-resonant material and clamping a flange of the speaker so as to prevent contact of the speaker with the cabinet wall, and at the same time flush with the front panel of the cabinet. The cabinet is substantially non-resonant and may be made of plywood or plastic.

65 Claims, 2 Drawing Sheets

FIG. 3
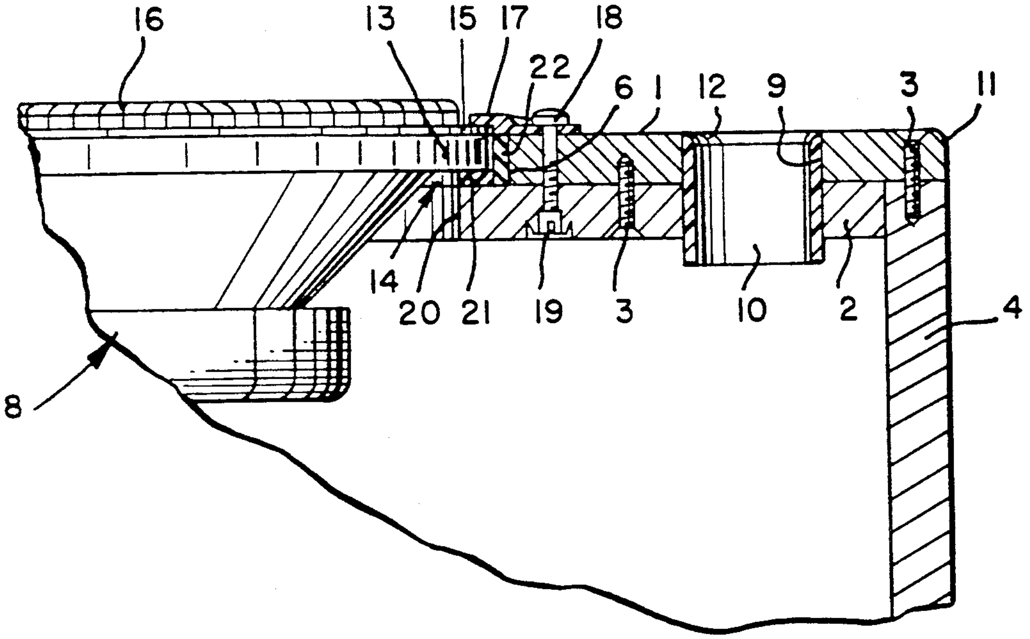
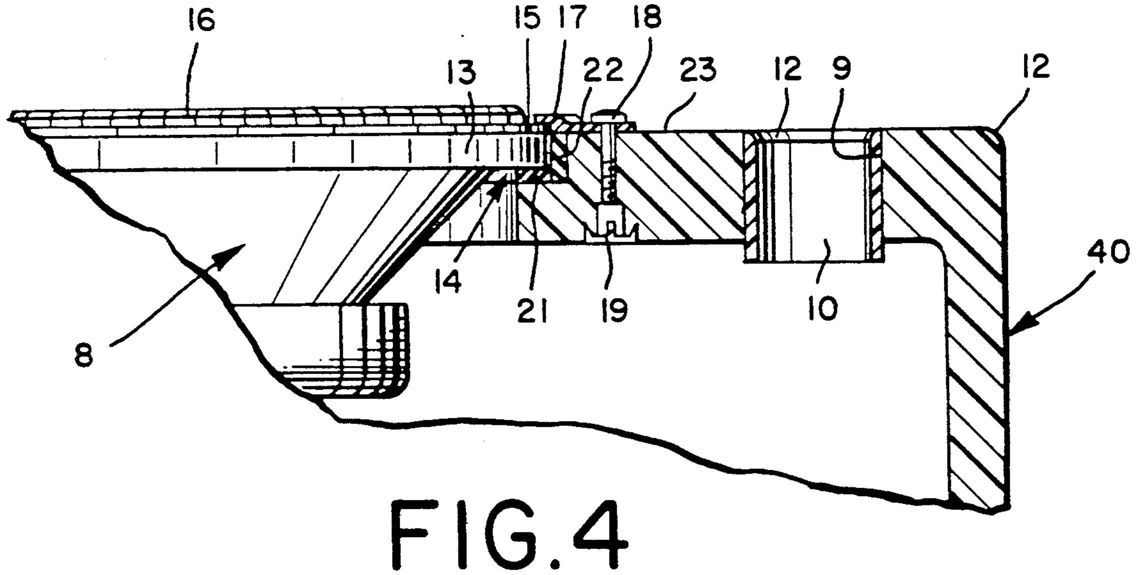
FIG. 4

LOW DISTORTION AUDIO SPEAKER CABINET

BACKGROUND OF THE INVENTION

The present invention relates to dynamic loudspeakers in general, and more specifically, to a low distortion, high volume output, cabinet for an audio speaker.

It has been known that the response of a drive in a loudspeaker system is modified by reflections from the cabinet panels, cabinet edge molding, mounting hardware and from other parts of the system. The effects of these reflections on the quality of the sound emanating from the system has been long recognized. Several studies have been conducted to determine the effects of reflections on the behavior of the loudspeaker system, the conclusion of which was that cabinet edge molding and speaker mounting surfaces were considered as specific reflecting surfaces. Therefore, suppression of such reflections has been a task for loudspeaker designers for a long time, inasmuch as minimizing or elimination of such reflections would lead to noticeable improvements in the performance of the loudspeakers.

Many publications disclosing various means for resonance dampening and suppression of aforedescribed reflections in dynamic loudspeakers are known.

U.S. Pat. No. 4,598,178 discloses a speaker having a resilient gasket which encircles the edge of the speaker and is clamped by retaining clips. The gasket separates the speaker from direct contact with the cabinet but does not isolate the speaker from resonating with the front panel. The speaker is fully surrounded by the gasket positioned below and attached to the inner face of the front panel of the cabinet. The reference shows a single mount of the speaker on the panel and does not address the problem of the suppression of reflections from the cabinet structure nor does it isolate the speaker from the front panel.

U.S. Pat. No. 3,275,100 discloses a loudspeaker assembly where the speaker is supported by means of a vibratory diaphragm secured to a rubber gasket. The assembly disclosed in this patent has an extremely large resonant surface formed by the diaphragm, which supports the speaker. The large resonant surface leads to the resonance of the speaker causing distortions due to the intimate contact between the speaker and the diaphragm. Further, the placing of the speaker at a distance from the front of the cabinet face causes reflections off the adjacent surfaces resulting in multiple reflections arriving at the listener at different times and thus, on higher distortion levels resulting from multiples of the audio source and low point source accuracy.

U.S. Pat. Nos. 4,624,337; 4,213,515 and 4,440,260 disclose further measures that could be taken to dampen vibrations caused by mounting panels of loudspeaker cabinets.

Accordingly, there is a need to provide an audio loudspeaker cabinet which ensures low distortion levels, increases speaker output, and yet is easy to make.

SUMMARY OF THE INVENTION

It is an object of the present invention to provide an improved low distortion audio speaker cabinet.

It is another object of the present invention to provide a speaker cabinet with speaker mounting means which provides such isolation of the speaker from the cabinet so that the speaker can vibrate independently from the cabinet.

It is a further object of the present invention to provide an audio speaker cabinet which ensures that the sound emanating therefrom would not only be louder and clearer, but so that the sound is identified by pinpoint localization as coming from the speaker, even from great distances from the cabinet.

A further object of the present invention is to provide a cabinet with a greater volume output size for size, over the prior art.

A further object of the present invention is to provide a better constructed audio loudspeaker cabinet, inexpensively constructable for the quality that it provides.

A further object of the present invention is to provide an audio loudspeaker cabinet having an overall resonant frequency above the frequency of the loudspeaker.

A further object of the present invention is to provide an audio speaker cabinet tuned by having the various parts having different resonant frequencies.

A further object of the present invention is to provide an audio speaker cabinet having a port which encloses the same volume of air as the total moving mass of the air from the speaker so that there is no vent compression when the speaker is used at normal levels.

A further object of the present invention is to provide an audio speaker cabinet having a port that avoids resistance and turbulence within the port.

A further object of the present invention is to provide an audio speaker cabinet having a port that avoids vent compression.

A further object of the present invention is to provide an audio speaker cabinet having a port that avoids vent compression and has a smooth surface which does not reflect sound.

A further object of the present invention is to provide an audio speaker cabinet which is mountable and sound coupleable with other such audio speaker cabinets.

A further object of the present invention is to provide an audio speaker cabinet having a molded cabinet molded of a carbon graphite composite material.

A further object of the present invention is to provide an audio speaker cabinet with the speaker mounted flush with the surface of the front panel.

Yet another object of the present invention is to provide an audio loudspeaker cabinet which is particularly suitable for guitar amplification.

In brief, in accordance with the present invention, there is provided an audio speaker system which comprises a cabinet having a front panel, a back panel and side panels, a speaker received in an opening formed in the front panel and a mounting assembly formed of non-resonant material and adapted to mount the speaker flush with an upper face of the front panel. The mounting assembly encircles the flange of the speaker so as to permit the speaker to float within the mounting assembly, thereby preventing contact between the speaker and the cabinet and thus substantially suppressing reflections from the cabinet walls and edges and resonance between the speaker and the panel, improving the performance of the loudspeaker.

BRIEF DESCRIPTION OF THE DRAWING

Although such novel feature or features believed to be characteristic of the invention are pointed out in the claims, the invention and the manner in which it may be carried out, may be further understood by reference to the description following and the accompanying drawings.

FIG. 3 is a partial sectional detail view of a grille mounting assembly and a port and isolation assembly of the audio speaker cabinet of the invention; and FIG. 4 is a partial sectional detail view of a grille mounting assembly and port assembly of the audio speaker cabinet of the present invention molded from a carbon graphite composite material.

DETAILED DESCRIPTION OF THE PREFERRED EMBODIMENT

Figure 1:
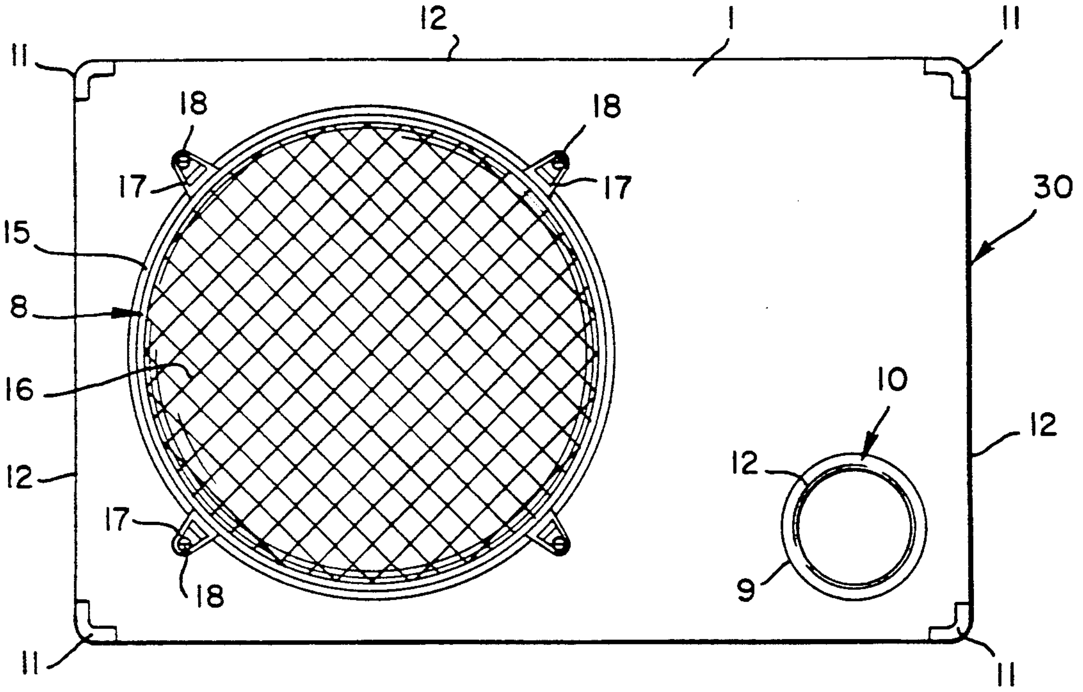
FIG. 1 is a front elevational view of the audio speaker cabinet according to the invention.

Referring now to the figures in greater detail, where like reference numbers denote like parts in the various figures.

There is shown a cabinet generally denoted at 30 and comprising an outer panel 1, to the bottom side of which an inner panel 2 is secured, preferably both by an adhesive layer and screws 3. The cabinet 30 is further comprised of two side panels 4 and a rear panel 5 to form a substantially parallelepiped shaped cabinet in which two juxtaposed panels 1 and 2 form the front wall of the audio speaker cabinet 30. Side panels 4 are secured to the outer panel 1 and to the back panel 5 by screws 3.

The front and back panels 1, 2 are made of thirteen ply Baltic birch, where the plies run in different directions so that there are twenty-six plies. The running of the plies in different directions aids in providing the resonant frequency of the front and back panels well above the resonant frequency of the speaker. The front or back panel with its laminates including glue has a resonant frequency of about 16 KHz, whereas a solid wood panel of the same dimensions has a resonant frequency of about 250 to 300 Hz. The rigidity provided to the panels 1, 2, provided by the separate plies, the running direction of the plies, and the glue in holding the plies together, helps to substantially raise the resonant frequency of the panels 1, 2.

The front panel 1 has an opening 6 which receives the audio speaker denoted at 8 and an outer mounting assembly which includes the grille 16 and its gasket 15. Speaker 8 is of a conventional construction and does not itself constitute the present invention. A second opening 9 formed in the outer panel 1 receives a port tube 10 which guides air into and out from the cabinet 30.

As shown in FIG. 1, corner strips 11 may be used to round out the corners of the cabinet 30. All edges 12 of the panels of the cabinet are curved or rounded at a radius of about 0.375 inches so that no sound reflective surfaces are exposed anywhere on the cabinet. The inner panel 2 is mounted directly to the outer panel 1 which further reduces resonances and distortion by stiffening the front panel assembly and raising its resonant frequency well above the speaker's 8 frequency spectrum. The port tube 10 is flanged at a mount thereof at a radius of 0.375 inch identical to that of the outer rounded edges 12 of the panels of the cabinet 30. These curved edges throughout the cabinet assembly act to cancel any diffraction effects which are typically caused by sharp edges in conventional audio speaker cabinets.

The various panels of the cabinet 30 are tuned by the nature of the nature of the structure and/or by bracing, so that each has a different resonant frequency.

The panels are preferably glued and screwed together, as distinguished from the prior art stapling. The screws 3 are preferably steel, self-tapping screws, which may countersink themselves into the panels. The countersunk portion (not shown) can then be filled with composition so as to leave a smooth surface over which the paint is applied to further smoothen the outer surface of the cabinet. The panels 1, 2 are further, both glued and screw attached to each other.

The external surface of the cabinet, namely the panels 1, 4, 5, including the top and bottom panels are painted, or coated with a very smooth, hard nonresonant paint. A number of coats, for example, eight, may be applied to the outer surface of each panel to increase a nonresonant effect and aid the unreflected passage of sound. The paint used for coating the panels may be one of cross-linked acrylic paints which are hard and nonreflective. Such hard acrylic paint further acts to stiffen the panel and provide a greater density and higher resonant frequency as compared to that of wood itself, since they act as a further lamination on the wood. The inside of the cabinet 30 preferably includes a layer of fiber glass (not shown) well known in the prior art, to avoid internal reflection and refraction of sound within the cabinet. The grade of fiber glass used may be that of the conventional household insulation fiber glass.

Figure 2:
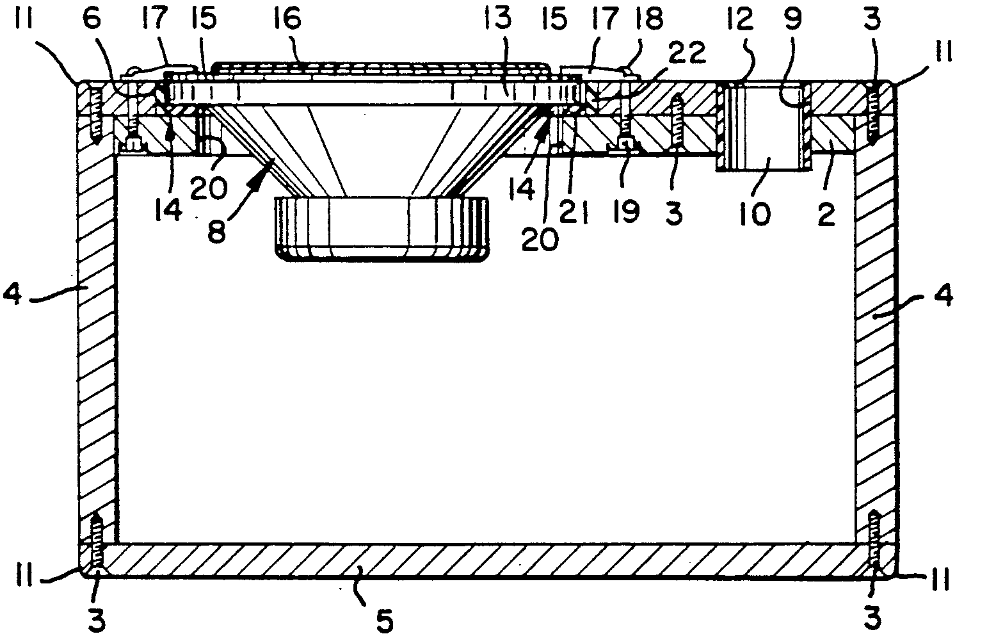
FIG. 2 is a bottom plan sectional side elevation view of the speaker cabinet of FIG. 1.

As best seen in FIGS. 2 and 3, the outer flange 13 of the speaker 8 is placed on a mount 14 so that the speaker 8 is flush with the outer surface of the panel 1. The combination of the opening 6 in the outer panel 1 and the opening 20 in the inner panel 2 forms a countersink to support the flange 13 of the speaker 8. Within the countersink is a speaker mount 14 formed of two mounting gaskets 21, 22. The mounting gaskets 21, 22 are preferably made from a closed cell neoprene sponge rubber material. Mounting gasket 22 circumferentially fills the opening 6 in the front panel over the width of the front panel, while mounting gasket 21 rests on the extending surface of the inner panel 2 flush against the mounting gasket 22, forming the speaker mount 14, upon which the flange 13 of the speaker 8 rests. The thickness of the mounting gasket 21 is such that the speaker 8 is maintained flush with the outer surface of the panel 1.

The speaker mount 14, with its gaskets 21 and 22, completely isolate the speaker 8 from the panels 1, 2. The speaker 8 has an internal open cone. Over the outer flange 13 of the speaker 8, a grille 16 is mounted.

The grille 16 has a circumferential hard neoprene gasket which envelops the outer edge of the grille 16. The gasket mount 15 lies flush with the outer speaker flange 13, just beyond the surface of the outer panel 1. The grille 16 is held on top of the speaker 8 by equidistantly spaced clamps 17, having openings therethrough to accept bolts 18. The bolts 18 pass through openings in panels 1, 2 and are screwed into a T-nut 19, engaged in panel 2.

The speaker 8 is therefore sandwiched between the hard rubber gasket 15 and the gasket 21 of the mount 14 and isolated from panel 1 by the gasket 22. Thus, the speaker 8 floats within this sandwich, acoustically detached from the panels 1, 2 by the substantially nonresonant gaskets 15, 21 and 22. The clamp 17 is further isolated from the panels 1, 2 by its bolted construction, with the bolt 18 passing through openings in the panels 1, 2 and by the mounting of the bolt 18 in the T-nut 19. The bolt 18 mounting enhances the acoustical detachment of the speaker 8 from the panels 1, 2.

The two mounting gaskets 21, 22 and the gasket 15 are of different durometer, hardness, which further acts to eliminate any transfer of resonance between the cabinet 30 and the speaker 8. The gaskets 15, 21, 22 do not transfer any sound waves.

The non resonant properties of the gaskets 15, 21, 22, help to dampen any resonance which may occur between the speaker 8 and the panels 1, 2. The gaskets 15, 21 and 22 are not effected by the limits of the audio spectrum of the speaker 8.

Each of the parts of the cabinet 30 is tuned to a different resonant frequency to further avoid any coupled resonance of the elements of the cabinet 30.

Each clamp 17 is made of plastic, for example, polyethylene, and has a resonant frequency of about 30 KHz. Each clamp bolt 18 is made preferably of steel while the T-nut 19 is preferably of zinc, so that the offsetting frequencies tend to cancel out against each other.

The grille 16 is preferably stamped from steel and opens and forms an opposing surface above the cavity, into which the speaker 8 protrudes, so that it will not impede the sound, but rather cancel reflections from the open cone of the speaker 8. The grille 16 is oriented so that the openings thereof are diamond in shape to form a pattern substantially in the form of the sound propagation.

The speaker 8 is mounted in close proximity to two of the four corners of the panel 1, as best shown in FIG. 1. The third corner is occupied by the port, which will be described in detail hereinafter. The fact that the speaker 8 is positioned substantially close to the three side walls of the cabinet 30 allows for more efficient sound coupling when a number of cabinets are placed together.

Referring now more specifically to FIG. 3, it will be seen that the port tube 10, the upper edge of which is flush with the outer face of panel 1, extends inwardly through the port opening 9 into the interior of cabinet 30. The port should typically enclose the same volume as the total mass of air moved by the speaker 8 so as to avoid vent compression when the speaker 8 is used at its normal levels. The port tube 10 is preferably made of polyvinyl rigid non-resonant material and its walls are polished to avoid resonance and turbulence within the port. The stiffness of the port made of PVC avoids any resonance induced distortion, while the polishing of the port eliminates vent compression caused by turbulence in the port at high volume levels. Mounting of the port 10 flush with the outer face of the front panel ensures a smooth entrance and exit of the air to and from the cabinet 30. Furthermore, such flush mounting ensures that sound waves emanating from both the speaker 8 and the port opening 9 are in phase so that any phases distortion is eliminated. As mentioned above, no sharp surfaces typically causing reflection and distortion of the emitting sound will result at the mouth of the port opening 9.

It should be appreciated that all parts used in the above described system are of different densities whose resonances are well above the audio spectrum of the speaker 8. This further reduces sound distortion effects created by resonance of different parts of the system. The port tube 10 and the speaker 8 are tuned so that there is no ripple effect. The port tube 10 uses the low frequency energy at the back of the cone of the speaker 8 to amplify. The turbulence within the cabinet 30 is prevented.

In FIG. 4, another preferred embodiment of the present invention is disclosed. A cabinet 40 is molded from a carbon graphite composite material such as "Kevlar" ®. The various panels are integral with the front panel 23 being of sufficient thickness to allow for the countersunk mounting of the speaker 8. In other respects, the embodiment of FIG. 4 is similar to the other embodiment. The cabinet 40 has a much higher resonant frequency than the cabinet 30 and does not require the bracing and tuning of the various panel parts to keep them from having similar resonant frequencies and to rigidize them to maintain very high resonant frequencies. The walls of the various panels can satisfactorily function at thicknesses from one quarter to three eigths of an inch. The "Kevlar ®" weighs about one quarter, the weight of a wooden structure and is three times as stiff. The molding greater enables the rounding of surfaces and of edges to avoid reflectiveness.

The terms and expressions which are employed are used as terms of description; it is recognized, though, that various modifications are possible.

It is also understood that the following claims are intended to cover all of the generic and specific features of the invention herein described, and all statements of the scope of the invention which, as a matter of language, might fall therebetween.

Having described certain forms of the invention in some detail, what is claimed is:

1. An audio speaker system comprising a cabinet having a front panel, a speaker, said speaker mounted within the front panel, speaker mounting means to mount said speaker flush with the outer wall of said front panel, at least said front panel having a resonant frequency above the resonant frequency of said speaker, said mounting means including substantially non-resonant material between said speaker and said panel, and said speaker floating within said mounting means substantially eliminating any transfer of resonance between said cabinet and speaker.

2. The system according to claim 1, wherein said mounting means include an outer mounting assembly and an inner mounting assembly, said speaker including a flange sandwiched between said outer mounting assembly and said inner mounting assembly.

3. The system according to claim 2, wherein said outer mounting assembly and said inner mounting assembly are formed of materials of differing durometer.

4. The system according to claim 2, wherein said outer mounting assembly and said inner mounting assembly are made of rubber material of different hardness.

5. The system according to claim 4, wherein said outer mounting assembly is made of hard neoprene material.

6. The system according to claim 4, wherein said inner mounting assembly is made of a neoprene closed cell sponge rubber.

7. The system according to claim 2, wherein said outer mounting assembly includes a grille, said grille including an outer circumference, said grille further including a gasket enveloping the outer circumference of said grille.

8. The system according to claim 1, wherein said front panel is double walled.

9. The system according to claim 2, wherein said front panel includes an outer panel and an inner panel secured to said outer panel.

10. The system according to claim 9, wherein said inner mounting assembly includes a first gasket attached to said inner panel and a second gasket extending at a right angle from said first gasket, said speaker flange being positioned over said first gasket surrounded by said second gasket.

11. The system according to claim 10, wherein said outer panel and said inner panel are coaxial and receive said speaker therethrough.

12. The system according to claim 11, wherein said mounting means further include clamp means fixed through said outer and inner panel and having a clamp portion clamping said outer mounting assembly to said speaker free of immediate contact between said speaker and said front panel.

13. The system according to claim 12, and further including means for securing said clamps to said front panel.

14. The system according to claim 13 wherein said securing means includes a bolt extending through said outer and inner panels of said front panel and a nut fastened to said bolt at the inner of said inner panel.

15. The system according to claim 14, wherein said nut is a T-nut.

16. The system according to claim 14, wherein said bolt is made of steel.

17. The system according to claim 14, wherein said nut is made of zinc.

18. The system according to claim 12, wherein said clamps are circumferentially spaced apart on said outer mounting assembly.

19. The system according to claim 12, wherein said clamps are made of plastic.

20. The system according to claim 1, wherein said cabinet includes side panels and a back panel, said front panel and said side and back panels being made of plywood.

21. The system according to claim 20, wherein all corners of said cabinet are rounded.

22. The system according to claim 21, wherein said cabinet has rounded edges at all panels thereof and at said front panel.

23. The system according to claim 2, wherein said speaker is offset towards one of said side panels.

24. The system according to claim 1, further including port means provided in said cabinet for admitting air into and exiting air from said cabinet.

25. The system according to claim 24, wherein said port means includes a port tube secured to said front panel and extending inwardly of said cabinet.

26. The system according to claim 25, wherein said tube is made of a substantially non-resonant material.

27. The system according to claim 26, wherein said tube is made of rigid polyvinyl.

28. The system according to claim 24, wherein said port means encloses a volume which is equal to a full mechanical displacement of air by said speaker.

29. The system according to claim 25, wherein said tube has a mouth at the outer face of said front panel said mouth flanging at a predetermined radius at said outer face.

30. The system according to claim 25, wherein said tube is mounted within said cabinet flush with the outer face of said front panel.

31. The system according to claim 25, wherein the inner surface of said tube is polished.

32. The system according to claim 20, wherein said cabinet is coated with a substantially non-resonant paint.

33. The system according to claim 32, wherein said paint is hard acrylic paint.

34. The system according to claim 20, wherein at least said front panel and said inner panels are made of wood plies running in different directions.

35. An audio speaker cabinet in combination with an audio speaker mounted thereto, comprising a front panel, a back panel and side panels forming said cabinet, mounting means for mounting said speaker in said cabinet flush with said front panel, said mounting means including substantially non-resonant material between said speaker and said panel to prevent direct contact between said speaker and said cabinet, and said panels having a resonant frequency above the resonant frequency of said speaker.

36. The combination according to claim 35, wherein said mounting means includes substantially non-resonant neoprene rubber material.

37. The combination according to claim 35, further including port means provided in said cabinet and having a mouth positioned flush with the outer surface of said front panel.

38. The combination according to claim 35, wherein said cabinet is molded from plastic.

39. The system according to claim 38, wherein said plastic is a carbon graphite composite.

40. The combination according to claim 38, wherein said mounting means include an outer mounting assembly and an inner mounting assembly, said speaker including a flange sandwiched between said outer mounting assembly and said inner mounting assembly.

41. The combination according to claim 40, wherein said outer mounting assembly and said inner mounting assembly are formed of materials of differing durometer.

42. The combination according to claim 40, wherein said outer mounting assembly and said inner mounting assembly are made of rubber material of different hardness.

43. The combination according to claim 42, wherein said outer mounting assembly is made of hard neoprene material.

44. The combination according to claim 42, wherein said inner mounting assembly is made of a neoprene closed cell sponge rubber.

45. The combination according to claim 41, wherein said outer mounting assembly includes a grille, said grille includes a gasket enveloping the outer circumference of said grille.

46. The combination according to claim 39, wherein said inner mounting assembly includes a first gasket attached to said front panel and a second gasket extending at a right angle from said first gasket, said speaker flange being positioned over said first gasket surrounded by said second gasket.

47. The combination according to claim 46, wherein said mounting means further include clamps fixed through said front panel and having a clamp portion clamping said outer mounting assembly to said speaker free of immediate contact between said speaker and said front panel.

48. The combination according to claim 47, and further including means for securing said clamps to said front panel.

49. The combination according to claim 48 wherein said securing means includes a bolt extending through said front panel and a nut inside said front panel fastened to said bolt.

50. The combination according to claim 49, wherein said nut is a T-nut.

51. The combination according to claim 49, wherein said bolt is made of steel.

52. The combination according to claim 49, wherein said nut is made of zinc.

53. The combination according to claim 47, wherein said clamps are circumferentially spaced apart on said outer mounting assembly.

54. The combination according to claim 47, wherein said clamps are made of plastic.

55. The combination according to claim 38, wherein all corners of said cabinet are rounded.

56. The combination according to claim 55, wherein said cabinet has rounded edges at all panels thereof and at said front panel.

57. The combination according to claim 35, wherein said speaker is offset towards one of said side panels.

58. The combination according to claim 35, further including port means provided in said cabinet for admitting air into and exiting air from said cabinet.

59. The combination according to claim 58, wherein said port means includes a port tube secured to said front panel and extending inwardly of said cabinet.

60. The combination according to claim 59, wherein said tube is made of a substantially non-resonant material.

61. The combination according to claim 60, wherein said tube is made of rigid polyvinyl.

62. The combination according to claim 58, wherein said port means encloses a volume which is equal to a full mechanical displacement of air by said speaker.

63. The combination according to claim 62, wherein said tube has a mouth at the outer face of said front panel said mouth flanging at a predetermined radius at said outer face.

64. The combination according to claim 59, wherein said tube is mounted within said cabinet flush with the outer face of said front panel.

65. The combination according to claim 59, wherein the inner surface of said tube is polished.

* * * * *